US008440973B1

(12) United States Patent
Fernandez et al.

(10) Patent No.: US 8,440,973 B1
(45) Date of Patent: May 14, 2013

(54) BIMORPH CANTILEVER ARRANGEMENT AND APPLICATIONS THEREOF

(75) Inventors: Felix E Fernandez, Mayaguez, PR (US); Nelson Sepulveda-Alancastro, Mayaguez, PR (US); Armando Rua, Yauco, PR (US); Rafmag Cabrera, Aguas Buenas, PR (US)

(73) Assignee: University of Puerto Rico, San Juan, PR (US)

( * ) Notice: Subject to any disclaimer, the term of this patent is extended or adjusted under 35 U.S.C. 154(b) by 571 days.

(21) Appl. No.: 12/660,933

(22) Filed: Mar. 5, 2010

Related U.S. Application Data

(60) Provisional application No. 61/157,675, filed on Mar. 5, 2009.

(51) Int. Cl.
*G01J 5/20* (2006.01)
(52) U.S. Cl.
USPC .................................................... 250/338.4
(58) Field of Classification Search .................. 250/332, 250/338.1, 338.4, 339.01, 339.02, 339.04
See application file for complete search history.

(56) References Cited

U.S. PATENT DOCUMENTS

| | | | |
|---|---|---|---|
| 6,140,646 A | 10/2000 | Busta et al. | |
| 6,335,478 B1 | 1/2002 | Chou et al. | |
| 6,392,233 B1 | 5/2002 | Channin et al. | |
| 6,399,947 B2 | 6/2002 | Yagyu et al. | |
| 6,835,932 B2 * | 12/2004 | Ishizuya et al. | 250/338.1 |
| 7,184,200 B2 | 2/2007 | Dalakos et al. | |

OTHER PUBLICATIONS

F. J. Morin; Oxides which show a metal-to-insulator transition at the neel temperature; *Physical Review Letters*; Jul. 1, 1959; pp. 34-36; vol. 3, No. 1; US.
N. Berglund and H. H. Guggenheim; Electronic Properties of $VO_2$ near the Semiconductor-Metal Transition; *Physical Review* Sep. 15, 1969; pp. 1022-1033; vol. 185, No. 5; US.
D. P. Partlow, S. R. Gurkovich, K. C. Radford, and L. J. Denes; Switchable fanadium oxide films by a sol-gel process *J. Appl. Phys*; Jul. 1, 1991; pp. 443-452; vol. 70, No. 1.; US.
J. R. Barnes, R. J. Stephenson, C. N. Woodburn, S. J. O'Shea, M. E. Welland, T. Rayment, J. K. Gimzewski, and CH. Gerber; A femtojoule calorimeter using micromechanical sensors; *Rev. Sci. Instrum.*; Dec. 1994; pp. 3793-3798; vol. 65, No. 12; US.
P. G. Datskos, P. I. Oden, T. Thundat, E. A. Wachter, R. J. Warmack, and S. R. Hunter; Remote infared radiation detection using piezoresistive microcantilevers; *Appl Phys. Lett.*; Nov. 11, 1996; pp. 2986-2988; vol. 69, No. 20; US.

(Continued)

*Primary Examiner* — Mark R Gaworecki
(74) *Attorney, Agent, or Firm* — Hoglund & Pamias, PSC; Roberto J. Rios

(57) ABSTRACT

The invention utilizes the changes in physical properties of materials during a solid-solid phase transition in order to enhance the sensitivity of cantilever IR detectors. The substantial changes in properties during insulator-to-metal transitions (IMTs) of some materials are useful for controlling purposes according to the invention. A cantilever arrangement is provided with a cantilever being coated with an insulator-to-metal transitions (IMTs) material. Bending of the cantilever is achieved when the temperature of the (IMTs) material is within its phase transition temperature range. A Focal Plane Array (FPA) for detecting Infrared (IR) radiation including the cantilever arrangement of the invention is also proposed.

34 Claims, 6 Drawing Sheets

OTHER PUBLICATIONS

P. I. Oden, P. G. Datskos, T. Thundat and R. J. Warmack; Uncooled thermal imaging using a piezoresistive microcantilever; *Appl Phys. Lett.*; Nov. 18, 1996; pp. 3277-3279; vol. 69, No. 21; US.

S. R. Manalis, S. C. Minne, and C. F. Quate, G. G. Yaralioglu, and A. Atalar; Two-dimensional micromechanical bimorph arrays for detection of thermal radiation. *Appl Phys. Lett.*; Jun. 16, 1997; pp. 3311-3313; vol. 70, No. 24; US.

J. Varesi, J. Lai, T. Perazzo, Z. Shi, and A. Majumdar; Photothermal measurements at picowatt resolution using uncooled micro-optomechanical sensors; *Appl Phys. Lett.*; Jul. 21, 1997; pp. 306-308; vol. 71, No. 3; US.

Qing-Ming Wang, Xiao-Hong Du, Baomin Xu and Eric Cross; Theoretical analysis of the sensor effect of cantilever piezoelectric benders; *Journal of Applied Physics*; Feb. 1, 1999; pp. 1702-1712; vol. 85, No. 3; US.

Perazzo, M. Mao, O. Kwon, A. Majumdar, J. B. Varesi, and P. Norton; Infrared vision using uncooled micro-optomechanical camera; *Applied Physics Letters*; Jun. 7, 1999; pp. 3567-3569; vol. 74, No. 23; US.

Nelson Sepulveda, Armando Rua, Rafmag Cabrera, and Felix Fernandez; Young's modulus of $VO_2$ thin films as a function of temperature including insulator-to-metal transition regime; *Applied Physics Letters*; 2008; pp. 191913-1-191913-3; vol. 92, No. 19; US.

P. G. Datskos, N. V. Lavrik, and S. Rajic; Performance of uncooled microcantilever thermal detectors; *Review of Scientific Instruments*; Apr. 2004; pp. 1134-1148; vol. 75, No. 4; US.

J. Y. Suh, R. Lopez, L. C. Feldman, and R. F. Haglund, Jr.; Semiconductor to metal phase transition in the nucleation and growth of $VO_2$ nanoparticles and thin films; *Journal of Applied Physics*; Jul. 15, 2004; pp. 1209-1213; vol. 96, No. 2; US.

M. Soltani, M. Chaker, E. Haddad, R. V. Kruzelecky, and D. Nikanpour, Optical switching of vanadium dioxide thin films deposited by reactive pulsed laser deposition; *J. Vac. Sci. Technol.*; May/Jun. 2004; pp. 859-864; vol. A 22, No. 3; US.

Y. J. Chang, C. H. Koo, J. S. Yang, Y. S. Kim, D. H. Kim, J. S. Lee, T. W. Noh, Hyun-Tak Kim and B. G. Chae; Phase coexistence in the metal-insulator transition of a $VO_2$ thin film; *Science Direct*; 2005; pp. 46-49; US.

Yong-Hee Han, Kun-Tae Kim, Hyun-Joon Shin, Sung Moon, and In-Noon Choi; Enhanced characteristics of an uncooled microbolometer using vanadium-tungsten oxide as a thermometric material; *Applied Physics Letter 2005*; pp. 254101-1-254101-3; vol. 86, No. 25; US.

D. Grbovic, N. V. Lavrik, P. G. Datskos, D. Forrai, E. Nelson, J. Devitt and B. McIntyre; Uncooled infrared imaging using bimaterial microcantilever arrays; *Applied Physics Letters*; 2006; pp. 073118-1-073118-3; vol. 89, No. 7; US.

Xin Wang, Shenglin Ma, Xiaomei Yu, Ming Liu, Xiaohua Liu, and Yuejin Zhao; IR imaging using a cantilever-based focal plan array fabricated by deep reactive ion etching technique; *Applied Physics Letters*; 2007; pp. 054109-1-054109-3; vol. 91, No. 5; US.

Kiril Zinoviev, Carlos Dominguez, Jose Antonio Plaza and Laura M. Lechuga; Optical waveguide cantilever actuated by light-, Applied Physics Letter; 2008; pp. 011908-1-011908-3; vol. 92, No. 5; US.

* cited by examiner

BIMORPH CANTILEVER ARRANGEMENT AND APPLICATIONS THEREOF

FIELD OF THE INVENTION

The invention relates to thermally induced moving systems, and, more particularly, to the enhancement of the sensitivity of cantilever detectors by means of the changes in physical properties of materials during insulator-to-metal transitions (IMTs).

BACKGROUND OF THE INVENTION

Detection of infrared (IR) signals and images has important scientific, commercial, and military applications. Advances in the last few decades have allowed extraordinary capabilities in IR sensing and thermal imaging. Further enhancements in resolution and sensitivity will enhance these capabilities. Images of IR-emitting objects can be formed by suitable optical elements onto a Focal Plane Array (FPA) or Staring Array. This is an array of detectors, usually rectangular, each of them corresponding to a pixel. For visible light the most common type of FPAs are the Charge-Coupled Device (CCD) and the Active Pixel Sensor (APS), which are based on silicon technology and are not useful in the IR range. For IR image acquisition with a FPA each pixel must be an IR-sensitive detector. In general, IR detectors can be classified as quantum detectors or thermal detectors. Quantum detectors, which rely on electron transitions in semiconductors, are efficient and can be manufactured in very small dimensions. However, since electron transitions can be caused by ambient thermal energy in the narrow-band semiconductors required for this application, IR quantum detectors require cooling during their operation, often to cryogenic temperatures (~77 K), in order to avoid thermal noise. This requirement is a serious obstacle in many applications for which cryogenic cooling cannot be provided.

Thermal detectors for IR radiation do not require cryogenic cooling and have the further advantages of very wide spectral response and nearly flat responsivity as a function of wavelength of the incident radiation. On the other hand, they have much lower detectivity than quantum detectors, and are generally not effective in very small sensing areas, which puts a lower limit on the device size and hence the pixel size possible for IR arrays based on thermal detectors. Therefore, development of highly sensitive uncooled IR detectors and arrays, which do not require cryogenic cooling, has substantial interest; since these allow simpler device fabrication, lower operation costs, and facilitates implementation in many settings. Uncooled thermal detectors and arrays for the IR are well known in the art and have been used for many years. In the most common types, the increased temperature at an IR absorbing surface is sensed by means of a thermopile, a thermistor, or a pyroelectric material, but more recently the mechanical flexure of a cantilever caused by absorbed IR energy is also being used in uncooled detectors.

In the last 15 years uncooled thermal detectors employing cantilevers or cantilever arrays have been developed. These employ the fact that a bi-material or "bimorph" cantilever will bend as its temperature changes due to differential thermal expansion of the two materials. Detection of cantilever bending by means of electrical response of the sensing material itself or, more commonly, by other mechanisms which sense cantilever motion, have been implemented using piezoresistance, field emission devices, thermopiles, pyroelectricity, and resistance.

However, thermal detectors that rely on changes of electrical properties of the sensing material or of structures coupled to the sensing material still require electrical connections to each pixel, along with the electronics to read and display the sensed information. The use of uncooled detectors which can be read by direct optical means provides further advantages in terms of simplicity of fabrication and implementation. Direct optical readout methods have been demonstrated for FPAs in which microcantilever array elements are deformed by the absorbed IR radiation and these in turn reflect or scatter visible light, which can be viewed directly by the eye or imaged onto a CCD. A similar principle is used for a different purpose in a proposed IR optical limiter based on microcantilevers. A technique employing evanescent wave coupling in planar optical waveguides joined to bimorph cantilevers has been proposed as well in order to detect their bending.

The sensitivity of the cantilever as an IR detector is proportional to both the square of the length of the cantilever and to the difference in thermal expansion coefficients of the two materials in the bimorph. Therefore, cantilevers lose sensitivity rapidly as their length is shortened. Also, the temperature increase $\Delta T$ at the pixel itself for a given net absorbed IR flux (energy per unit area per unit time) $q_{net}$ is $\Delta T = q_{net} A/G$, where A is the pixel area and G is the thermal conductance, which includes contributions due to conduction, convection, and radiation losses. Therefore, other things being equal, a device sensitive to a smaller $\Delta T$ for a given absorbing area can actually be designed with smaller pixels, and hence can achieve higher image resolution. Currently, however, cantilever lengths in IR FPAs are limited to lengths of ~100 µm or more. While cantilevers can be easily fabricated in sizes of order 10 to 100 µm with current surface micromachining and standard contact lithography technologies, and in fact there is no technological obstacle to fabrication of cantilevers with sub-micron dimensions, it is the working principle of these devices that in practice places a lower limit on the size of a useful cantilever. It must be stressed that in all the cases known in the art the actuating principle for the microcantilever-based FPAs, whether for electrical or direct optical detection, is the differential thermal expansion coefficients of the two materials in the cantilever structure. In fact, in order to obtain the maximum deflection per temperature degree, the materials that form the "bimorph" cantilever need to be chosen so they have a large enough difference in thermal expansion coefficients, which adds a constraint on the materials that can be used. Actuation based on differential thermal expansion leads to a fundamental materials property restriction which places a lower limit on the size of the detectors and hence the size of the pixels which the FPA can usefully have. The present invention addresses this restriction and makes it possible to design and fabricate microcantilever-based FPAs with substantially reduced pixel sizes.

SUMMARY OF THE INVENTION

The present invention proposes a novel cantilever arrangement to enhance the sensitivity of cantilever IR detectors using the changes in physical properties of materials during a solid-solid phase transition.

According to an aspect of the invention, a thermally-induced moving assembly is provided with a substrate material and a solid-to-solid phase transition material in contact with said substrate material, wherein said solid-to-solid phase transition material causes at least a portion of said substrate material to move when subjected to a temperature change.

According to another aspect of the invention, the solid-to-solid phase transition material comprises an insulator-tometal transition material. The insulator-to-metal transition material can be selected from $V_2O$, $V_2O_3$ and $VO$.

According to still another aspect of the invention, the insulator-to-metal transition material is doped with at least one doping material. The at least one doping material comprises Tungsten (W). In another aspect, the doped insulator-to-metal transition material comprises: $V_{1-x}W_xO_2$, X is selected from about 0.01 to about 0.02.

According to a further aspect of the invention, at least one Infrared (IR) absorbent material such as but not limited to: gold black, carbon-filled polymer, $Si_3N_4$, and a cyanine compound is provided in contact with said solid-to-solid phase transition material.

According to an aspect of the invention, a binding material is provided in contact with said solid-to-solid phase transition material; said binding material is selected to bind with a target material, wherein said target material is characterized by a specific Infrared (IR) spectral band.

According to another aspect of the invention, the substrate material is selected from: Silicon (Si), Silicon Dioxide ($SiO_2$) and Sapphire.

According to one aspect of the invention, a method of thermally inducing movement of an element is achieved by providing a solid-to-solid phase transition material in contact with said element; and inducing said solid-to-solid phase transition material to transition between phases by means of a temperature change in said solid-to-solid phase transition material; at least a portion of said element moves in response to said solid-to-solid phase transition material transitioning between phases.

According to another aspect of the invention, the temperature change selectively occurs within a phase transition temperature region of said solid-to-solid phase transition material.

According to still another aspect of the invention, the method provides for selectively modifying said phase transition temperature region by doping said solid-to-solid phase transition material with at least one doping material.

According to an aspect of the invention, the element used in the method is a cantilever.

According to a further aspect of the invention, the method provides for priming said solid-to-solid phase transition material to a desired temperature prior to said solid-to-solid phase transition material being subjected to said temperature change.

According to an aspect of the invention, a Focal Plane Array (FPA) for detecting Infrared (IR) radiation has a plurality of cantilever elements; each cantilever element having a layer of a solid-to-solid phase transition material in contact with said cantilever element; said solid-to-solid phase transition material causes said cantilever element to move when said solid-to-solid phase transition material transitions between phases in response to said Infrared (IR) radiation.

According to another aspect of the invention, the array includes means for priming said solid-to-solid phase transition materials to a desired temperature prior to said solid-to-solid phase transition material being subjected to a temperature change caused by said Infrared (IR) radiation.

According to still another aspect of the invention, at least one of the solid-to-solid phase transition materials of the array is selectively designed to have a different phase transition temperature range from the other solid-to-solid phase transition materials.

According to one aspect of the invention, the array includes means for sensing the change in electrical properties of said solid-to-solid phase transition materials.

BRIEF DESCRIPTION OF THE DRAWINGS

The invention can be better understood with reference to the following drawings. The components in the drawings are not necessarily to scale, emphasis instead being placed upon clearly illustrating the principles of the present invention. In the drawings, like reference numerals designate corresponding parts throughout the several views.

Figure 1:
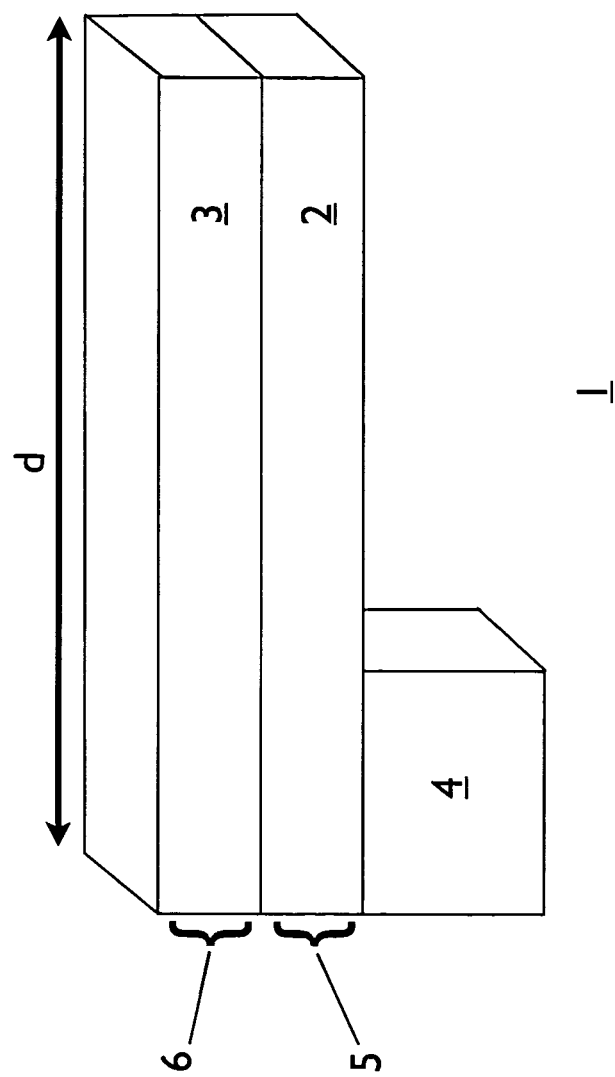
FIG. 1 illustrates a bimorph cantilever according to an embodiment of the invention.

Further features and advantages of the invention will become apparent from the following detailed description taken in conjunction with the accompanying figures showing illustrative embodiments of the invention

DETAILED DESCRIPTION OF THE INVENTION

The present invention utilizes the changes in physical properties of materials during a solid-solid phase transition in order to enhance the sensitivity of cantilever IR detectors. In particular, the substantial changes in properties during insulator-to-metal transitions (IMTs) of some materials are useful for controlling purposes according to the invention. It is well known that electrical properties of some of these materials change through many orders of magnitude and that optical properties in some spectral ranges can also change dramatically. Our invention demonstrates that elastic properties also change significantly through the IMT of $VO_2$. Vanadium dioxide is the most studied of materials exhibiting IMTs because its phase transition temperature, at $T_{tr}$~68° C., is not far from normal ambient temperature, and because its property changes are substantial. This phase transition is accompanied by a change in crystal structure. $VO_2$ changes from a monoclinic (M) phase (low temperature phase) to a tetragonal, rutile type structure (R) phase (high temperature phase) as it is heated through its transition temperature. While the two structures are different, the actual change in atomic positions is relatively small, corresponding to a relative volume change $\Delta V/V$ of order 0.001, and a small density change (from 4.666 g/cm$^3$ in the M phase to 4.651 g/cm$^3$ in the R phase). While solid-solid phase transitions normally cause cracks in bulk crystals, and in bulk $VO_2$ crystals the transition usually causes fractures or cracks, in thin films or very small crystals it is well known that repetitive cooling-heating cycling is possible without crack formation. The physical properties of the IMT material exhibit hysteric behavior through cooling-heating cycles. The width of these hysteresis cycles can be very small (~1 degree or less) in crystalline material and much wider in polycrystalline material. The extent of the transition region, not to be confused with the width of the hysteresis loop, can be also greatly affected by film microstructure. It should be noted in addition that the temperature at which the IMT occurs in $VO_2$ could be greatly influenced by the addition of appropriate dopants. Of particular interest in relation to the invention described here, it is possible to reduce the IMT temperature by doping, for example, with tungsten. For films of $V_{1-x}W_xO_2$ with x=0.014 it has been shown that the transition temperature can be reduced to 36° C., which is only a few degrees higher than normal room temperature. Hence, with appropriate choice of dopants, composition, and microstructure, it is possible to engineer the response of $VO_2$ thin films in terms of temperature of the IMT and width of the hysteresis loop. The following description explains $VO_2$ as the material exhibiting the IMT, and indeed it is a preferred material due to the properties which have been demonstrated. However, it is to be understood that the invention can be implemented with other materials which exhibit a solid-solid phase transition at a convenient temperature (near room temperature, for instance), and with a microstructural change which is large enough to produce substantial changes in film tension, but not sufficient to cause cracks in the film or delamination from the substrate after repeated heating-cooling cycles.

Figure 2:
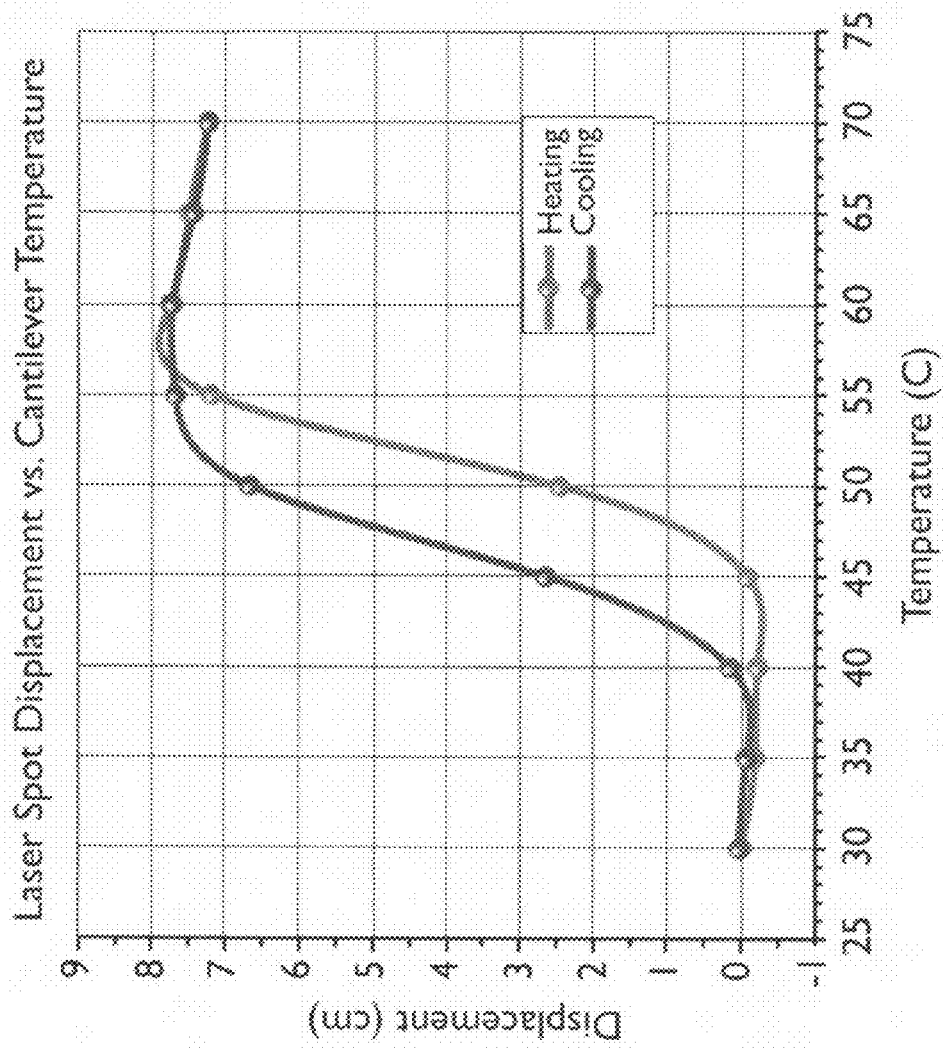
FIG. 2 shows a Displacement vs. Temperature plot according to an embodiment of the invention.

Dramatic bending of a bimorph cantilever during the thermally induced IMT of the $VO_2$ film material has been observed and shown to occur within the span of a few degrees. The structure, as illustrated in FIG. 1, was fabricated by depositing a thin polycrystalline $VO_2$ film 3 having a thickness 6 on commercially available silicon microcantilevers 2 having a thickness 5 and an anchor 4 affixed at one end thereof, wherein the film was grown by Pulsed Laser Deposition. In the experiment the tip of a cantilever with a length of 350 µm was illuminated with a He—Ne laser and displacement of the reflected beam was measured as the cantilever temperature was increased using a Peltier heater. FIG. 2 shows a graph of the measured results. From the displacement and the distance from the cantilever to the observation plane the bending angle was estimated to be θ~23° as the temperature increased from 45° C. to 55° C., which corresponds to the phase transition region of the $VO_2$ film in this particular cantilever structure. The cantilever tip displacement can be determined from the approximate formula:

$$d=L/\theta*(1-\cos\theta), \quad (1)$$

where L is the cantilever length and θ is the angle in radians. The calculated tip displacement is 69 µm, or ~7 µm/degree Kelvin. This bending is substantially greater than is possible due only to the difference in thermal expansion coefficients of silicon and $VO_2$ or indeed for any pairs of materials used for bimorph cantilevers. For example, previous work shows deflections of 80 nm, 86 nm and 50 nm per degree Kelvin for bimorph cantilevers composed of gold/silicon nitride, aluminum/silicon nitride, and gold/silicon nitride respectively. For comparison, bending should be normalized to the cantilever length. The effective lengths (i.e., including bimorph "legs") of the cantilevers used in the previous works are 200 µm, 100 µm, and 130 µm, respectively. Hence, the tip displacement per unit length (both in the same units), per degree Kelvin in each case is $4\times10^{-4}$, $0.9\times10^{-4}$, and $3.8\times10^{-4}$, respectively. In contrast, the response observed in the present invention is equivalent to $200\times10^{-4}$ per degree Kelvin. This is 50 times larger than the best case of the previous works cited above.

Figure 3:
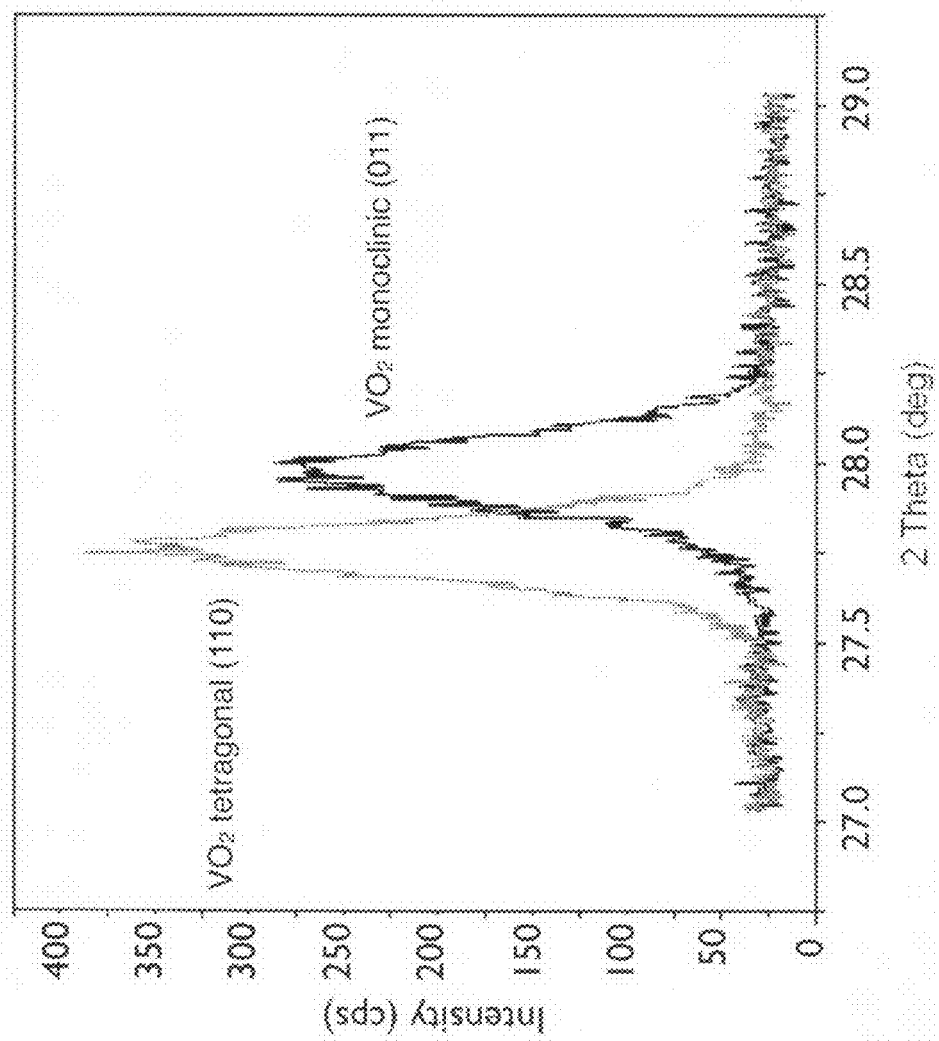
FIG. 3 is a plot of X-ray diffraction scans for $VO_2$ thin films according to an embodiment of the invention.
Figure 4:
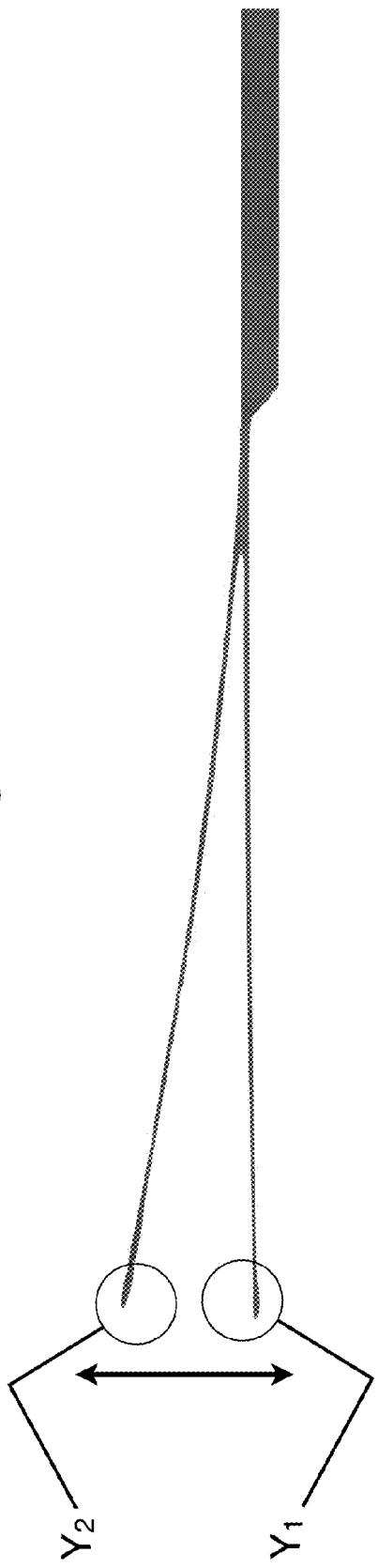
FIG. 4 shows double-exposure recorded images of a $VO_2$/Si cantilever bending according to an embodiment of the invention.

The large cantilever flexure observed experimentally occurred only at the IMT temperature region, which clearly connects the effect with the structural change in $VO_2$. Furthermore, the mechanism can be clearly understood from the observed behavior of the crystal structure in $VO_2$ thin films. FIG. 3 shows x-ray diffraction scans for the dominant peak in a $VO_2$ thin film at two different temperatures: room temperature and ~80° C., which is over 10 degrees above the transition temperature. This film was grown on a silicon substrate under similar conditions to those used for preparation of the $VO_2$/Si cantilever used in the experiment previously described. The peak obtained at room temperature corresponds to the (011) monoclinic reflection, while at high temperature the peak observed is for the (110) tetragonal reflection. No other peaks were observed in the XRD scans, which shows that the film is well oriented with its (011) monoclinic plane parallel to the sample surface. During the process of raising the temperature the monoclinic (011) peak does not shift to lower angles. Instead, its intensity is reduced as the intensity for the tetragonal (110) peak increases. The somewhat lower angle (by ~0.2° 2θ) of the high temperature peak indicates that the associated interplanar atomic spacing (d) is larger (by ~0.02 Å). Without taking into consideration the structural transition, and assuming any reasonable positive value for the material's Poisson ratio (ν positive and less than 0.5), this result implies that the film should contract along directions parallel to the interface. However, since the M→R phase transition does occur in this temperature range and the effective unit cell volume for unstressed $VO_2$ crystals is increased (actually the monoclinic unit cell is halved into two identical tetragonal cells, so the monoclinic cell volume must be compared with twice that of the tetragonal cell), this is not necessarily the case and the structural change of the film material must be considered more carefully. From consideration of the equilibrium lattice constants for the two phases, it can be shown directly that, while the volume of the doubled R-phase unit cell is larger than the volume of the M-phase unit cell, the area of the (110) plane bounded by the tetragonal unit cell is reduced with respect to the area of the (011) plane bounded by the monoclinic unit cell by ~0.6 Å. This shows that in fact the crystal structure is expected to contract in this plane during the M→R transition. Since the film microcrystals in the $VO_2$/Si samples are constrained by the substrate precisely along this plane, as shown by the XRD results, the transition will cause a contractile stress on the films. In the cantilever structure this stress is sufficient to cause the observed bending. In fact, a low-power microscope was used to directly observe the bending. Images of the cantilever at room temperature and at a temperature slightly above $T_{tr}$ were recorded and are shown in FIG. 4. The heated cantilever is bent upwards in the image from a first lower temperature position $Y_1$ to a second position $Y_2$ for the high temperature state. This corresponds to flexure towards the $VO_2$ side, demonstrating that in fact the $VO_2$ film has contracted as a result of the M→R transition. The observed bending was reversible and the cantilever behaved in the same fashion over repeated heating-cooling cycles. No bending whatsoever could be observed for uncoated Si cantilevers in the same arrangement.

It should be noted that the $VO_2$-coated cantilever structures can be alternatively optimized for maximal bending, and that further enhancements are possible with other choices of cantilever substrate and geometry, film thickness, and exact film composition and microcrystalline structure. It must be emphasized that the large effect observed is due to this structural change, which causes significant stress changes between the film and the substrate. While bimorph cantilevers currently known in the art also operate on the basis of the stress changes between the two materials employed, these are due only to differential thermal expansion and no state transformations occur. A crucial aspect of the invention is that one of the two materials in the bimorph must exhibit a solid-solid phase transformation in the operational temperature range of the device. Furthermore, for a practical device it is required that this transformation should occur reversibly and without causing deleterious effects such as cracks in the film or delamination.

From the foregoing, it can be seen that a bimorph $VO_2$/Si or similar microcantilever, if it is at an initial temperature already within the IMT region, will be extremely sensitive to further heat absorption. This implies that a device incorporating these microcantilevers as IR sensors would have to be maintained at or near a preselected temperature. However, this would be only somewhat higher than normal room temperature, which is a much easier task than cooling the device to cryogenic temperatures. Furthermore, as shown before, using an alloy such as $V_{1-x}W_xO_2$ with adequate composition (x from 0.01 to 0.02) instead of pure $VO_2$ can reduce the transition region to ambient temperature (or even lower) if desired.

While our experimental results prove that cantilever bending response by the type of $VO_2$/Si structure described can be well over an order of magnitude larger than for the bimorph cantilevers known in the art, the fact that in our case flexure is due to the structural change in the $VO_2$ film and not simply to differential thermal expansion of the two materials signifies that the heat which must be absorbed to cause the bending is mainly associated with the heat of transformation and not the specific heat. Since for many materials the heat of transformation or latent heat can be large compared with the specific heat, it is necessary to consider this matter for the case of the IMT for $VO_2$. In pure homogeneous materials under equilibrium conditions phase transitions occur at a fixed transition temperature and the temperature remains constant as the transition occurs. However, in IMTs there can be an extended transition temperature region and the $T_{tr}$ value (such as $T_{tr}=68°$ C. for $VO_2$ crystals) usually quoted is in fact the center value for this region. The width of this transition region in the case of $VO_2$ can be as narrow as ~1° or even less, or as wide as tens of degrees, depending on specific details of the microstructure and the composition (including both deviations from stoichiometry and the presence of dopants). This finite extension of the transition region is associated with the slightly different transition temperatures of different grains or microcrystals with different characteristics. It has been demonstrated for $VO_2$ thin films that the two phases coexist at different temperatures through the IMT region and gradually change from one to the other as the temperature changes. Hence, since a $VO_2$ sample will undergo a change of temperature in going through the IMT, the energies associated with both the latent heat and the specific heat should be taken into consideration. In the following, we estimate the total energy required to allow the IMT in a $VO_2$/Si cantilever structure like the one used in our experiment and compare it with the energy requirement for a similar structure in which the IMT does not occur and, instead, only a temperature increase results from heat absorption.

First, the energy required for the IMT in $VO_2$ associated with the IMT only is calculated using the known value of the enthalpy of transformation (latent heat). This is 4.27 kJ/mole, or 51.48 J/g. Second, since the IMT actually occurs over a range of $\Delta T=10K$ in the case of the particular $VO_2$/Si cantilever used, there is an additional amount of heat (per gram) which must be transferred to the $VO_2$ material in order to cause the temperature increase. This equals its specific heat (c) times the temperature change. The specific heat for $VO_2$ is approximately 58.6 J/mole·K, or 0.707 J/g·K. The heat required to raise the temperature of $VO_2$ by $\Delta T=10K$ is then 7.07 J/g. Finally, the total energy associated with the transformation in the case of a $VO_2$ sample like the one used in our experiment is estimated to be the sum of these two: 58.55 J/g, whereas for a similar material which does not undergo a phase transition over this temperature range the heat required would be just the second of the two. Hence, it is clear that the amount of heat driving the response is greater by a factor of more than 8 in the first case. This would imply a lower thermal sensitivity for the transition-based cantilever than for the ordinary kind. On the other hand, as shown before, the bending response per degree change can be 50 times greater for the transition-based cantilever, even in the case of non-optimized devices.

In addition, transition-based cantilevers can have a relative advantage in terms of heat losses. It is well known in the art that one of the requirements in the design of uncooled thermal IR detectors, and of microcantilever detectors in particular, is that heat losses must be limited in order to favor the desired response (bending action in the case of cantilevers). Losses due to thermal conduction are reduced using only narrow connecting stripes between the sensing area and the rest of the body of the device, effectively suspending the sensing surface to reduce conduction losses. In the case of cantilever structures this is achieved by designing them with long and narrow pairs of "legs", and rather sophisticated structures are required to minimize these losses. Since heat flux is proportional to the temperature gradient, the bending response in a transition-based cantilever, being mostly related to the heat of transformation, will be less sensitive to conduction heat losses. In fact, this could present an obstacle precisely because if heat dissipation is too low the response will become sluggish, as the energy is "locked-up" in the higher temperature phase. Hence, an optimum design will balance the heat conduction characteristics of the cantilever between the opposite requirements of high sensitivity (improved by low heat conductance) and fast decay (improved by high heat conductance). This design compromise is in principle no different from the one which must be made in the design of ordinary microcantilever IR detectors, but in the case of transition-based cantilevers the correct compromise will likely favor much simpler structures, since geometries with faster heat dissipation will be preferred.

Microcantilever IR detectors in general are negatively affected by thermomechanical noise, which is caused by spontaneous vibration of the cantilevers even in thermal equilibrium with the surroundings. In this context, shorter and stiffer cantilever structures can have lower noise levels. Hence the smaller sizes required for transition-based cantilevers can improve this characteristic.

The responsivity ($\Re$) of light detectors is usually defined as an electrical output (voltage or current) per unit input incident light power. For cantilever-based thermal detectors, while the output may ultimately be electrical as well, it is convenient to define temperature responsivity in terms of the cantilever displacement, measured at the tip, per degree change in the temperature of the cantilever:

$$\Re_T = \Delta z / \Delta T, \tag{2}$$

where z represents the position of the cantilever tip. As explained before, for the present invention the energy absorbed by the material mainly drives the phase transition, but since there is a concomitant temperature change associated with the IMT, it is possible to define temperature responsivity in the same way as before. Similarly, the responsivity can be increased by appropriate design of the cantilever structure. The response of a bimorph microcantilever based on differential thermal expansion has been previously described in the prior art showing that the displacement of the cantilever tip resulting from a given input power P absorbed by the sensor is proportional to P and to the difference in thermal expansion coefficients ($\alpha_2 - \alpha_1$) of the two materials in the bimorph, which can essentially be taken as constant within a relatively broad range of temperatures. In the present case this analysis cannot be directly applied because instead of the constant ($\alpha_2 - \alpha_1$) term a temperature-dependent function would be required to describe the rate of stress developed between the two materials in the bimorph cantilever as the temperature changes. Nevertheless, at temperatures near the center of the IMT it has been observed that the relationship between cantilever tip displacement and temperature is approximately linear. This suggests that the response can be modeled in a similar way in this restricted region. Our results show that with $VO_2$/Si cantilevers this nearly linear region extends through 5 to 10 degrees. With appropriate selection of growth conditions, including use of cantilever substrates other than silicon, or by using appropriate dopants in the $VO_2$ film, the temperature range over which the transition occurs, and hence the range of linearity, can be made narrower or wider.

Figure 5:
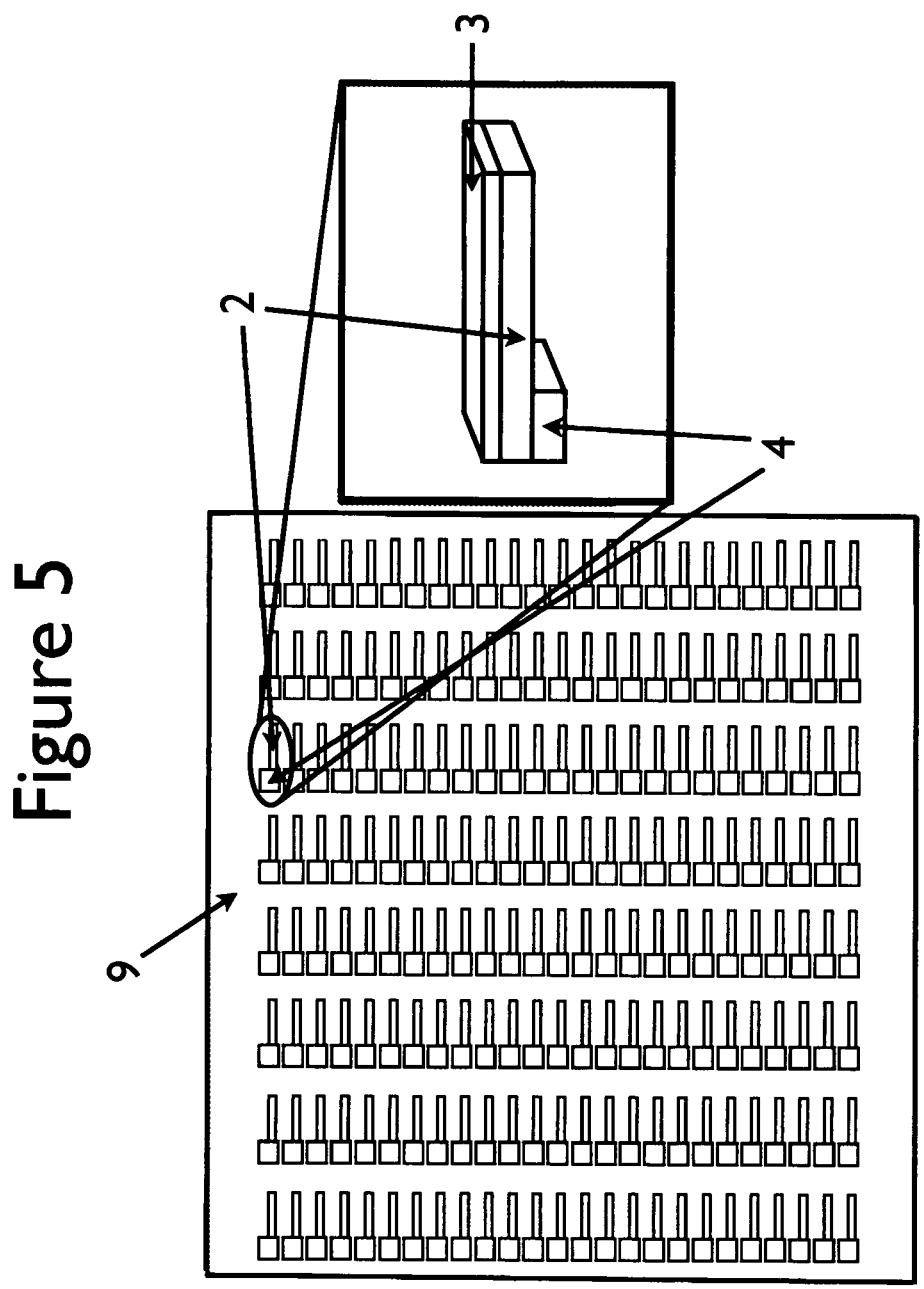
FIG. 5 illustrates a microcantilever array using the bimorph cantilever according to an aspect of the invention.

FIG. 5 illustrates an array 9 of microcantilever structures according to the invention fabricated from silicon or another suitable material 2, coated with a thin film of $VO_2$ or doped $VO_2$ material 3 and affixed to anchor 4. This array, used as a FPA, is located at the image position for an IR optical imaging system. The array is "primed" by raising its temperature, if required, to the IMT region. The priming of the FPA structure can be accomplished by any of several simple means such as but not limited to: a built-in heating wire and thermocouples or other temperature sensors, along with an external controller, in order to actively maintain a constant environmental temperature in the device. Once the device is "primed", the IR flux of the image causes local heating of the cantilever surfaces, which increases their temperature further and causes them to bend due to the effect described before. Detection of cantilever bending can be achieved by any of the means known in the prior art. As described before, direct optical readout is particularly convenient for this purpose.

Due to the hysteresis, when the cantilever is cooled its deflection behavior per degree Kelvin will not return following exactly the same path as during heating. This could lead to misleading information about the absorbed IR radiation as the cantilever is heated and then cools—essentially a memory effect—for example, as the IR image at the FPA changes. However, if the composition and microstructure of the $VO_2$-based layer is appropriately chosen, the width of the hysteresis curve can be greatly reduced and this effect can be minimized. Otherwise, if the hysteresis curve has a significant width but is well characterized before its use in the FPA application, the heating/cooling behavior can be identified by a comparator and compensated by electronic circuits in the readout systems.

Figure 6:
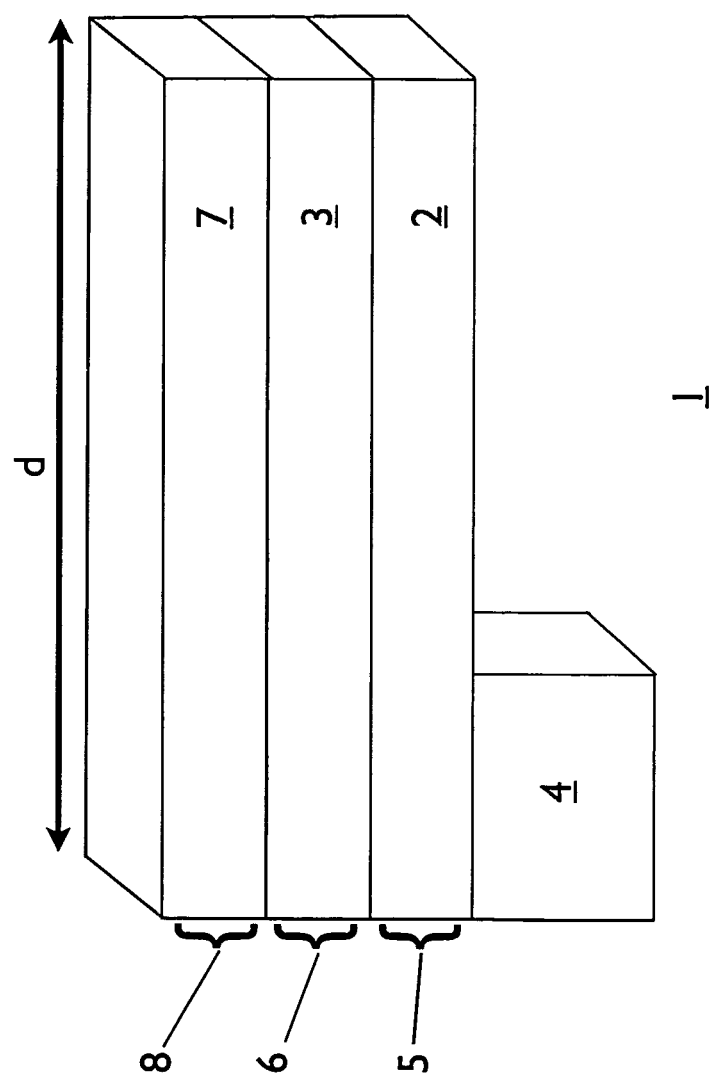
FIG. 6 illustrates another bimorph cantilever according to an embodiment of the invention.

It is also envisioned that a third, highly absorbing thin film material 7 having a thickness 8, such as gold black could be added on the $VO_2$ layer 3 having a thickness 6, in order to increase the IR absorbance by the cantilever structure, as shown in FIG. 6. This thin absorbing layer would have some effect on the mechanical response of the structure, but the strain caused by the $VO_2$ film during the IMT would still be the dominant effect by far. In addition, materials with high absorption in particular IR bands could be detected by a cantilever system by coating the $VO_2$/Si or similar cantilever (or cantilever array) with the material. The strong IR absorption would cause the cantilever to increase its temperature, and bend as the $VO_2$ reaches its IMT, according to the principles described before. This could be implemented by functionalizing the bimorph cantilever surface with a coating which selectively binds the material in question. Then, its presence would be detected by illuminating the cantilever or cantilever array with IR in the spectral band of interest for the target material. If the bound material is present, then the cantilever will be heated more rapidly than an uncoated but otherwise identical reference cantilever, and this difference could be easily detected. This embodiment of the invention, which can find application in sensing specific chemicals, would not replace sensitive and accurate techniques such as spectroscopy. However, its simplicity and speed would allow applications with very low cost and almost instantaneous response, even if the chip with the device is for one-time use. All organics have specific IR absorption bands, and are hence prime candidates for detection in this manner. As examples, alcohols and phenols have strong absorption bands in the 970-1250 $cm^{-1}$ frequency region, amines at 1000-1250 $cm^{-1}$, alkenes at 1900-2000 $cm^{-1}$, and alkanes at 2850-3000 $cm^{-1}$.

The IMT material can be appropriately chosen to have a very narrow hysteresis curve serving in direct-reading instruments analogous to the ones reported in the prior art. The narrow hysteresis curve would be required in this case because it would not be possible to correct electronically for the memory effect described before.

A silicon substrate is preferably used to fabricate the cantilevers themselves prior to coating with $VO_2$ or similar films. However, other materials can be used as substrates. Particularly convenient ones are amorphous $SiO_2$ and crystalline sapphire. $VO_2$ can be grown as well-oriented films on $SiO_2$ glass, and epitaxially on different sapphire crystal cuts. The latter is of particular interest because a $VO_2$/sapphire cantilever design which takes into consideration the sapphire crystal orientation along the cantilever direction may maximize the strain developed through the IMT for the $VO_2$ film.

Instead of $VO_2$ and $VO_2$ alloys, other embodiments can use different IMT materials that behave in a similar manner to $VO_2$. Since, in general, other materials of this type present transitions at other temperatures, their use may be adequate for detection in other operational temperature ranges. For example, it is well known that $V_2O_3$ has an IMT at a temperature of 150 K, associated with electrical property changes by six or seven orders of magnitude. A cantilever structure using $V_2O_3$ instead of $VO_2$ as the functional material would have to be cooled to this temperature range in order to work in the manner described for $VO_2$-based structures. While this means that the detector or FPA would no longer be "uncooled", it would still be much simpler to fabricate than cooled semiconductor detectors and FPAs.

Any of these embodiments using $VO_2$ or a similar IMT material can be altered to become a "hybrid" detector, in which the substantial change in electrical properties of the material through the IMT is also sensed. This would increase the fabrication complexity, since conductive wiring or paths to each of the cantilevers would have to be fabricated in the device. On the other hand, this dual-principle operation would allow a continuous error-checking ability for each pixel. The electrical properties of the $VO_2$ (or similar) film outside the IMT region continue to change as a function of temperature, albeit not as dramatically. This is particularly the case for $VO_2$, which is a semiconductor at temperatures below its $T_{rr}$. Hence, a hybrid device would still afford useful readings outside its maximum sensitivity region.

While the embodiments described so far employ some form of detection of the bending of cantilever structures as a result of the thermally induced phase transition, an alternative mode of operation for some applications can be based on the fact that the resonance frequency of the bimorph cantilever can change substantially through the phase transition. To take advantage of this fact the cantilever or cantilever arrays must be made to oscillate, which can be done by attaching the sensor structure to a piezoelectric actuator or by integrating piezoelectric actuators into the device.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

We claim:

1. A thermally-induced moving assembly comprising:
   a substrate material;
   a solid-to-solid phase transition material in contact with said substrate material, wherein said solid-to-solid phase transition material causes at least a portion of said substrate material to move when subjected to a temperature change.

2. The assembly of claim 1, wherein said solid-to-solid phase transition material comprises an insulator-to-metal transition material.

3. The assembly of claim 2, wherein said insulator-to-metal transition material is selected from the group consisting of: $V_2O_3$ and VO.

4. The assembly of claim 2, wherein said insulator-to-metal transition material comprises: $VO_2$.

5. The assembly of claim 1, wherein said insulator-to-metal transition material is doped with at least one doping material.

6. The assembly of claim 5, wherein said at least one doping material comprises Tungsten (W).

7. The assembly of claim 5, wherein said doped insulator-to-metal transition material comprises: $V_{1-x}W_xO_2$; X is selected from about 0.01 to about 0.02.

8. The assembly of claim 1, further comprising at least one Infrared (IR) absorbent material in contact with said solid-to-solid phase transition material.

9. The assembly of claim 8, wherein said at least one (IR) absorbent material comprises at least one of: gold black, carbon-filled polymer, $Si_3N_4$, and cyanine compound.

10. The assembly of claim 1, further comprising a binding material in contact with said solid-to-solid phase transition material; said binding material is selected to bind with a target material, wherein said target material is characterized by a specific Infrared (IR) spectral band.

11. The assembly of claim 1, wherein said substrate material is selected from the group consisting of: Silicon (Si), Silicon Dioxide ($SiO_2$) and Sapphire.

12. A method of thermally inducing movement of an element comprising:
    providing a solid-to-solid phase-transition material in contact with said element; and
    inducing said solid-to-solid phase transition material to transition between phases by means of a temperature change in said solid-to-solid phase transition material;
    at least a portion of said element moves in response to said solid-to-solid phase transition material transitioning between phases.

13. The method of claim 12, wherein said temperature change selectively occurs within a phase transition temperature region of said solid-to-solid phase transition material.

14. The method of claim 13, further comprising selectively modifying said phase transition temperature region.

15. The method of claim 14, wherein said phase transition temperature region is modified by doping said solid-to-solid phase transition material with at least one doping material.

16. The method of claim 15, wherein said at least one doping material comprises Tungsten (W).

17. The method of claim 16, wherein said doped insulator-to-metal transition material comprises: $V_{1-x}W_xO_2$; X is selected from about 0.01 to about 0.02.

18. The method of claim 12, wherein said solid-to-solid phase transition material comprises an insulator-to-metal transition material.

19. The method of claim 18, wherein said insulator-to-metal transition material is selected from the group consisting of: $V_2O_3$ and VO.

20. The method of claim 18, wherein said insulator-to-metal transition material comprises: $VO_2$.

21. The method of claim 12, wherein said element is made from a material selected from the group consisting of: Silicon (Si), Silicon Dioxide ($SiO_2$) and Sapphire.

22. The method of claim 12, wherein said element comprises a cantilever.

23. The method of claim 12, further comprising:
    priming said solid-to-solid phase transition material to a desired temperature prior to said solid-to-solid phase transition material being subjected to said temperature change.

24. A Focal Plane Array (FPA) for detecting Infrared (IR) radiation comprising:
    a plurality of cantilever elements;
    each cantilever element having a layer of a solid-to-solid phase transition material in contact with said cantilever element; said solid-to-solid phase transition material causes said cantilever element to move when said solid-to-solid phase transition material transitions between phases in response to said Infrared (IR) radiation.

25. The array of claim 24, further comprising:
    means for priming said solid-to-solid phase transition materials to a desired temperature prior to said solid-to-solid phase transition material being subjected to a temperature change caused by said Infrared (IR) radiation.

26. The array of claim 24, wherein said solid-to-solid phase transition materials comprise an insulator-to-metal transition material.

27. The array of claim 26, wherein said insulator-to-metal transition material is selected from the group consisting of: $V_2O_3$ and VO.

28. The array of claim 26, wherein said insulator-to-metal transition material comprises: $VO_2$.

29. The array of claim 26, wherein said insulator-to-metal transition material is doped with at least one doping material.

30. The array of claim 29, wherein said at least one doping material comprises Tungsten (W).

31. The array of claim 30, wherein said doped insulator-to-metal transition material comprises: $V_{1-x}W_xO_2$; X is selected from about 0.01 to about 0.02.

32. The array of claim 24, wherein said plurality of cantilever elements is made from a material selected from the group consisting of: Silicon (Si), Silicon Dioxide ($SiO_2$) and Sapphire.

33. The array of claim 24, wherein at least one of said solid-to-solid phase transition materials is selectively designed to have a different phase transition temperature range from the other solid-to-solid phase transition materials.

34. The array of claim 24, further comprising:
    means for sensing the change in electrical properties of said solid-to-solid phase transition materials.

* * * * *